United States Patent

Nakagawa et al.

Patent Number: 5,449,977
Date of Patent: Sep. 12, 1995

[54] APPARATUS AND METHOD FOR GENERATING PLASMA OF UNIFORM FLUX DENSITY

[75] Inventors: Satoshi Nakagawa, Kyoto; Yoshifumi Tahara; Masahiro Ogasawara, both of Tokyo, all of Japan

[73] Assignees: Matsushita Electric Industrial Co., Ltd., Osaka; Tokyo Electron Limited, Tokyo, both of Japan

[21] Appl. No.: 326,360

[22] Filed: Oct. 20, 1994

Related U.S. Application Data

[63] Continuation of Ser. No. 45,874, Apr. 15, 1993, abandoned.

Foreign Application Priority Data

Apr. 17, 1992 [JP] Japan .................................. 4-098056

[51] Int. Cl.⁶ ............................................ H01J 37/00
[52] U.S. Cl. ............................ 315/111.51; 315/111.41
[58] Field of Search .................... 315/111.41, 111.51, 315/111.61, 111.71

[56] References Cited

U.S. PATENT DOCUMENTS

| | | | |
|---|---|---|---|
| 4,950,956 | 8/1990 | Asamaki et al. | 315/111.21 |
| 5,032,202 | 7/1991 | Tsai et al. | 315/111.41 X |
| 5,079,481 | 1/1992 | Moslehi | 315/111.41 |
| 5,081,398 | 1/1992 | Asmussen et al. | 315/111.41 |

FOREIGN PATENT DOCUMENTS

| | | |
|---|---|---|
| 0223975 | 6/1987 | European Pat. Off. . |
| 0479189 | 4/1992 | European Pat. Off. . |

OTHER PUBLICATIONS

Chen, "Introduction To Plasma Physics And Controlled Fusion", 2nd Ed., vol. 1, Chap. 2, 1984, Plenum Press, New York, pp. 19–51.

Primary Examiner—David Mis
Attorney, Agent, or Firm—Willian Brinks Hofer Gilson & Lione

[57] ABSTRACT

Under a reduced pressure, an RF electric field is applied at a right angle to a main face of an article-to-be-treated such as a semiconductor, wafer placed on a cathode in treatment chamber. At the same time, a magnetic field is applied thereto by a magnetic field applying device to generate a plasma by a magnetron discharge. The magnetic field is formed in such a fashion that adjacent magnetic lines of flux are not in parallel with one another on the main face of the article-to-be-treated. Charged particles in the plasma drift in a diverging direction with Lorenz force so as to prevent electrification of the article-to-be-treated.

13 Claims, 18 Drawing Sheets

F I G. 1
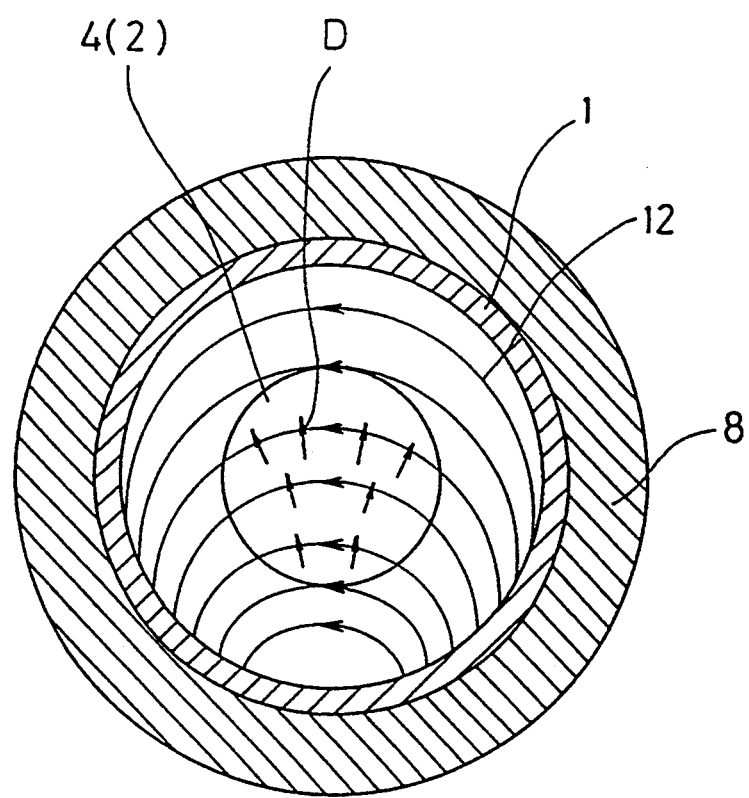

F I G. 7
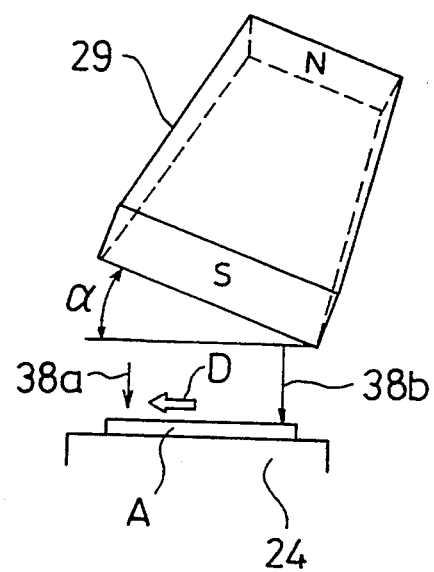

APPARATUS AND METHOD FOR GENERATING PLASMA OF UNIFORM FLUX DENSITY

This is a continuation of application Ser. No. 08/045,874 filed Apr. 15, 1993, now abandoned.

BACKGROUND OF THE INVENTION

This invention relates to apparatus and method for generating a plasma employed to thin film deposition, etching and the like.

Recently, a plasma treatment is widely used in semiconductor manufacturing processes Which require micro-fabrication. In general, a cylindrical plasma etching apparatus, parallel plate plasma etching apparatus, microwave plasma etching apparatus and the like is well known as those for plasma treatment. A magnetron etching system is also developed for generating a magneto-exited plasma from a treatment gas by magnetron discharge with an RF electric field and a magnetic field. In the magnetron etching system, an efficiency of plasma generation is made high by applying the magnetic field to the plasma.

An example of conventional plasma treatment apparatus and method is described with reference to the drawings.

FIG. 17 is a sectional front view of the conventional plasma treatment apparatus, and FIG. 18 is a sectional plan view thereof. In the figures, a reference numeral 1 indicates a treatment chamber. 2 is a cathode. 3 is an anode. 4 is an article-to-be-treated. 5 is a power source. 6 is a gas inlet. 7 is a pumping port. 8 is a magnetic field applying device.

As shown in FIG. 17, the article-to-be-treated 4 is placed on the cathode 2 Which is connected to the power source 5. The anode 3 is grounded. A treatment gas is introduced to the treatment chamber 1 from the gas inlet 6. The treatment gas is, for example, 50 sccm $CHF_3$. The pressure in the treatment chamber 1 is controlled to a desired pressure of, for example, 5 Pa by pumping through the pumping port 7. Thereafter, an RF electric power of, for example, 13.56 MHz and 800 W is applied to a space between the cathode 2 and the anode 3 from the power source 5 to generate a plasma. A direction of an electric field 9 between the cathode 2 and the anode 3 is indicated by arrows in FIG. 17.

As shown in FIG. 18, a magnetic field 10 whose magnetic lines of flux are uniformly in parallel with one another at least on the article-to-be-treated 4 is applied by the magnetic field applying device 8 to the space between the cathode 2 and the anode 3 concurrently with the application of the electric field. The electric field 9 in FIG. 17 (not shown in FIG. 18) is applied at a right angle to the paper of FIG. 18.

In the presence of the electric field 9 and the magnetic field 10 which intersect with each other, Lorentz force acts on each of charged particles in the plasma. Therefore, the charged particles drift in a direction of arrows D in FIG. 18, while gyrating in a cycloid motion. This drift increases the number of collision of the charged particles, increasing a degree of ionization of the gas, and thus creating a plasma. The article-to-be-treated 4 is exposed to the plasma to carry out the plasma treatment such as etching.

With the above conventional construction in FIGS. 17 and 18, however, the magnetic field 10 is applied in parallel on the article-to-be-treated 4, which causes nonuniformity of plasma density due to drift of charged particles. In detail, the charged particles move in the direction indicated by the arrows D in FIG. 18 (upward in the paper). Therefore, electrified regions which are polarized to a positive region and a negative region are generated at both ends of the article-to-treated 4 (upper and lower parts of the paper). Such charge-up damages the article-to-be-treated 4 owing to static electricity. For example, in a process of manufacturing a semiconductor device, this means breakdown or degradation of the semiconductor device. At a manufacturing process of highly integrated semiconductor device, the yield is lowered.

To solve the above problem, a method for contemplating a uniformed plasma density by rotating a magnet is employed. FIG. 19 is a sectional front view of a conventional magnetron etching system having a rotary magnet. The magnetron etching system 30 is essentially composed of a sealed treatment chamber 21, a pair of upper and lower electrodes 22, 23 opposed to each other with a space left between them in the treatment chamber 21, a magnet 29, as a magnetic field applying device, rotatably arranged outside of the treatment chamber 21 and above the upper electrode 22, and an RF power source 32 for supplying an RF electric power to a space between upper and lower electrodes 22, 23.

An object, e.g., a semiconductor wafer A (hereinafter referred to it as wafer) which is a substrate to be treated is etched in the treatment chamber 21. Inside of the treatment chamber 21 is kept vacuum by pumping means (vacuum pump) 25 connected to a pumping port 31 provided at a lower side part of the treatment chamber 21. A bottom wall composed of the lower electrode 23 and a side wall of the treatment chamber 21 are insulated from each other by an insulating member 34. The lower electrode 23 has at its center a disk-shaped susceptor 24 and the wafer A is supported on the susceptor 24. For supporting the wafer A on the susceptor 24 firmly, a chuck mechanism such as an electrostatic chuck 26 is provided on the susceptor 24 to attract and hold the wafer A.

A disk-shaped space 27 is formed inside of the upper electrode 22 so as to oppose to the susceptor 24, and a plurality of gas diffusing pores 28 communicate with the space 27 so as to let the treatment gas through into the treatment chamber 21. A treatment gas supplying source 37 is connected via a massflow controller 36 to a gas introducing pipe 35 which is connected with a gas supplying passage 39 communicating with the space 27, so that the treatment gas (100 sccm $CHF_3$, for example) supplied from the treatment gas supplying source 37 is introduced into the treatment chamber 21 via the space 27 and the diffusing pores 28. Heating means for heating the treatment gas over an air temperature as needed may be provided to supply the treatment gas through the heating means.

A temperature adjusting mechanism (not shown) capable of setting the temperature of the wafer A to a desired temperature ($-100°$ C. to $+200°$ C., for example) is provided at the lower electrode 23. The RF power source 32 whose one end is grounded is connected via a capacitor 33 to the lower electrode 23. The RF power source 32 supplies an RF electric power of, for example, 13.56 MHz to the space between upper and lower electrodes 22, 23. Thus, an electric field is applied to the wafer A.

The magnet 29 provided outside of the treatment chamber 21 and above the upper electrode 22 forms a magnetic field in a direction in parallel with a surface of the wafer A. The magnet 29 is rotated at a desired speed by a driving mechanism (not shown) such as a motor to form the magnetic field in a direction intersecting with the electric field applied to the wafer A.

For etching the wafer A by a system with the above construction, the wafer A is conveyed from a spare room (not shown) into the treatment chamber 21 via a load-lock chamber, and is positioned and attracted on the electrostatic chuck 26. Thereafter, the vacuum pump 25 pumps up the air in the treatment chamber 21 from the pumping port 31 to be 5 Pa.

Then, the treatment gas is supplied from the space 27 via the diffusing pores 28. When the RF power source 32 supplies the electric power to the space between upper and lower electrodes 22, 23, the electric field is generated at a right angle to the surface of the wafer A. Concurrently, since the magnetic field is applied by the magnet 29 to the space between upper and lower electrodes 22, 23, the magnetic field 38 in parallel with the surface of the wafer A and the electric field intersecting with the magnetic field 38 are formed and a magneto-excited plasma is generated by magnetron discharge. With the plasma the wafer A is etched.

According to the conventional magnetron etching system with the rotary magnet, the local nonuniformity of plasma density is averaged with its passage of time, but momentary plasma densities are still not uniform.

FIG. 20 is a schematic plan view showing a relation between the wafer A as a substrate to be treated and the magnetic field 38 at a moment in the magnetron etching system in FIG. 19. FIG. 21 shows distributions of a plasma density, an etch rate E/R and an electric potential $V_{DC}$ at a section (X—X section on a P-Q plane) intersecting at right angle with the magnetic field 38 in FIG. 20. Since the charged particles drift in a direction of an arrow D in FIG. 20 owing to Lorentz force, the plasma density and the etch rate on the P-Q plane of the wafer A are decreased from P toward Q and the potential $V_{DC}$ is increased inversely. Accordingly, the plasma density and the potential $V_{DC}$ are nonuniform, so that the electrified regions polarized to a negative region and a positive region are caused at both ends of the wafer A. Such charge-up may cause dielectric breakdown of a gate oxide layer of the wafer A and degradation of property thereof. It may be considered that ion sheath has a gradient in the surface of the wafer A because of a gradient of the potential $V_{DC}$ therein, therefore etching formation shall be deflected because ion travels in a direction intersecting at a right angle with the sheath.

A method that a plasma density is decreased to a degree not to damage a wafer is proposed as another etching method. However, the etch rate and throughput are lowered.

SUMMARY OF THE INVENTION

The present invention has its object of providing apparatus and method for generating a plasma in which nonuniformity of plasma density is minimized and charge-up of the article-to-be-treated is prevented.

To attain the above objects, in the present invention, an electric field and a magnetic field are applied to a plasma space so as to realize a divergent drifting direction of charged particles in the plasma. The charged particles drift in the diverging direction (not in a parallel direction as in the conventional one) so as to obtain a uniform plasma density. The uniform plasma density lessens the charge-up of the article-to-be-treated and reduces damage due to static electricity.

When the present invention is employed, for example, to a manufacturing process of a semiconductor device, plasma treatment with high efficiency and less breakdown is performed, with improvement in yield and reliability of the semiconductor device.

BRIEF DESCRIPTION OF THE DRAWINGS

FIG. 1 is a schematic sectional plan view of a plasma treatment system for explaining a magnetic field distribution in a plasma treatment method according to an embodiment of the present invention.

FIG. 7 is a schematic perspective view showing a fifth example of the magnetic field applying device.

PREFERRED EMBODIMENT OF THE PRESENT INVENTION

Description is made below about apparatus and method for plasma treatment according to an embodiment of the present invention, with reference to accompanying drawings.

Figure 2:
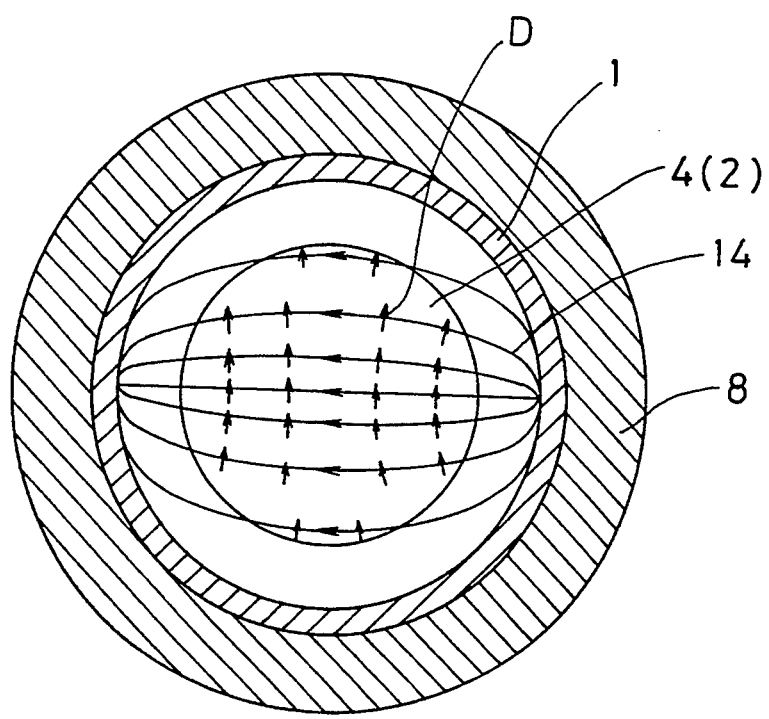
FIG. 2 is a equivalent view to FIG. 1 for explaining another magnetic field distribution in the plasma treatment method according to the embodiment of the present invention.
Figure 18:
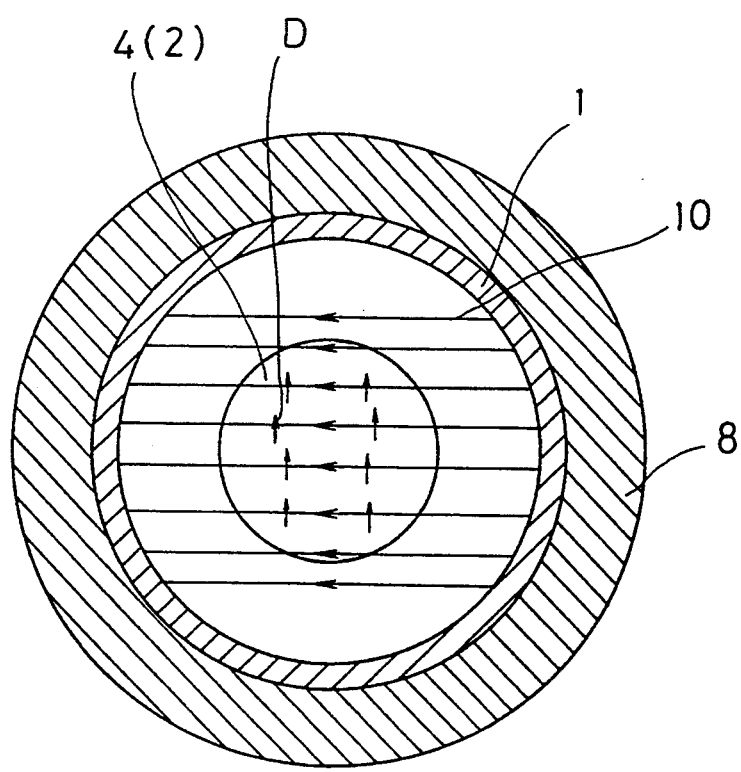
FIG. 18 is a schematic sectional plan view of the plasma treatment system in FIG. 17.

FIGS. 1 and 2 show a principle of a plasma treatment method according to the embodiment of the present invention, and correspond to FIG. 18 showing a conventional example.

In FIG. 1, a magnetic field applying device 8 applies a magnetic field 12 so that adjacent magnetic lines of flux are not in parallel with one another on a surface of an article-to-be-treated 4. In other words, the magnetic lines of flux of the magnetic field 12 are generated radially from one end of the article-to-be-treated 4 (lower part of the paper of FIG. 1). When a magnet is placed at the lower part of the paper, such magnetic lines of flux in FIG. 1 are formed. The magnet has an N-pole at a right hand and an S-pole at a left hand at the lower part of the paper. Accordingly, the magnetic lines of flux are never in parallel with one another on the article-to-be-treated 4. Concurrently with the application of the magnetic field, an electric field (not shown) is applied at a right angle to the paper.

Owing to the electric field and the magnetic field 12 intersecting with each other, Lorentz force acts on each of charged particles in a plasma. The charged particles with Lorentz force drift in a direction of arrows D, while gyrating in cycloid motion. At this time, the magnetic field 12 is applied so that the charged particles drift to diverge from one end to an opposed end of the article-to-be-treated 4. This drift increases a number of collision of the charged particles and a degree of ionization of a treatment gas, thus obtaining the plasma efficiently. The article-to-be-treated 4 is exposed in the plasma for plasma treatment such as etching. Since a drifting direction of the charged particles is diverged as shown by the arrows D in FIG. 1, a plasma density is uniformed, compared with a conventional case (FIG. 18) in which a parallel magnetic field is applied. Thereby, a semiconductor device and the like are prevented from breakdown due to charge-up.

In FIG. 2, a magnetic field 14 generated by the magnetic field applying device 8 has magnetic lines of flux which gradually curve from a straight line substantially passing through a center of the article-to-be-treated 4 toward both sides thereof. The line passing through the center of the article-to-be-treated 4 is in a right-left direction of the paper. When a magnet is placed so that an N-pole thereof is on a right side and an S-pole thereof is on a left side of the paper, such magnetic lines of flux in FIG. 2 are formed. Accordingly, the charged particles at a lower part than the center of the article-to-be-treated 4 is diverged toward the end of the article-to-be-treated 4 (upper part in the paper) as shown by the arrows D. Wherein, the magnetic field 14 is applied so that a distribution thereof in the treatment chamber 1 is symmetrical with respect to up and down and right and left on a plane shown in FIG. 2.

In this case, also, the drifting direction of the charged particles is diverged as shown by the arrows D in FIG. 2. Therefore, the plasma density is made uniform compared with the conventional case (FIG. 18) in which the parallel magnetic field is applied, thus preventing the breakdown of semiconductor due to the charge-up. Further, since the distribution of the magnetic field 14 is symmetrical with respect to up and down and right and left on the plane shown in FIG. 2, the plasma treatment to the article-to-be-treated 4 in disk shape is performed more uniformly by rotating an applying direction of the magnetic field 14.

Figure 19:
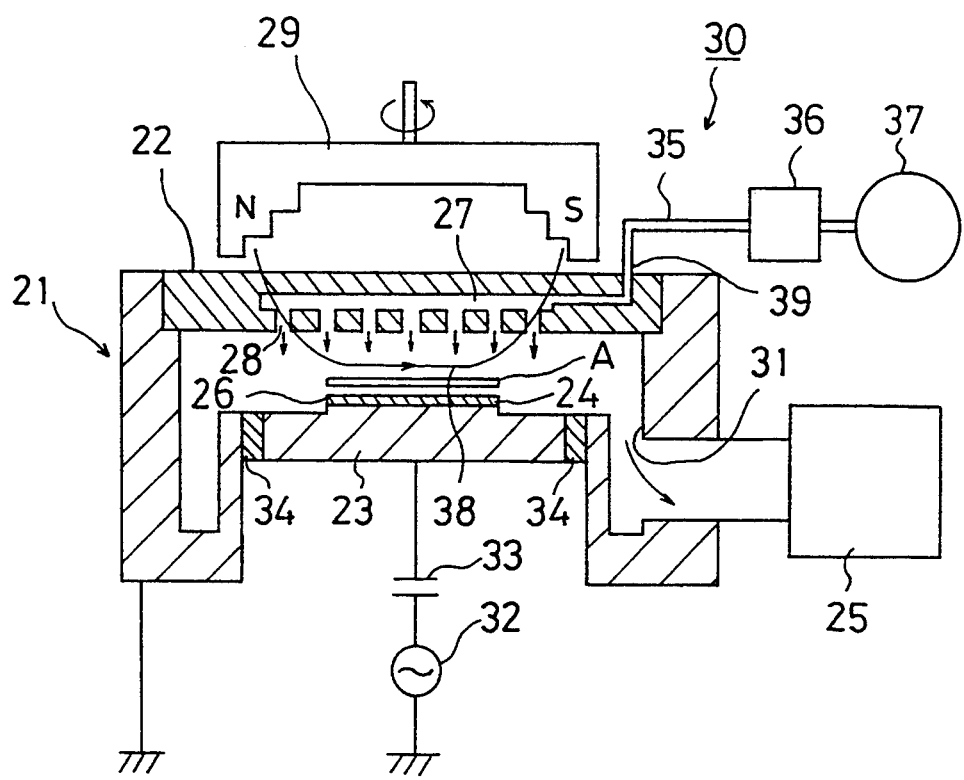
FIG. 19 is a sectional front view of a conventional magnetron etching system.
Figure 20:
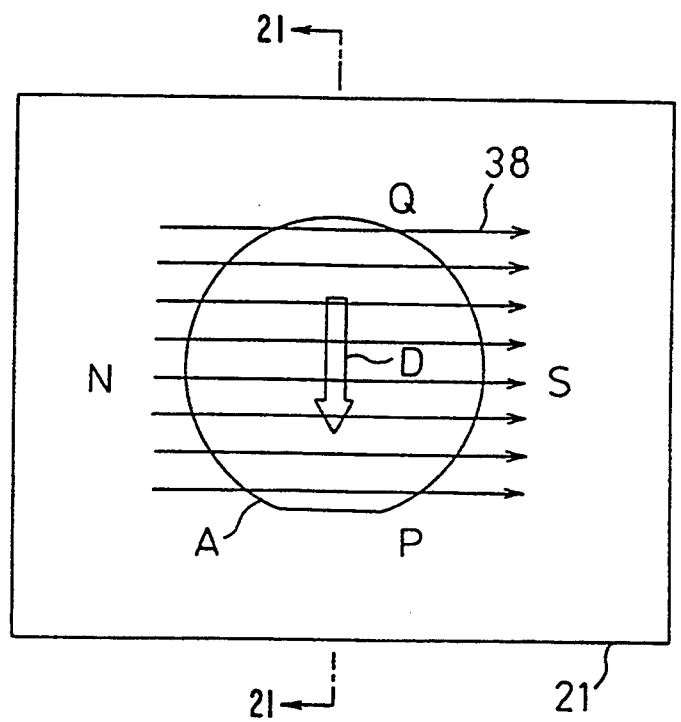
FIG. 20 is a schematic plan view showing a relation between a wafer as a substrate to be treated and a magnetic field in the magnetron etching system in FIG. 19.
Figure 21:
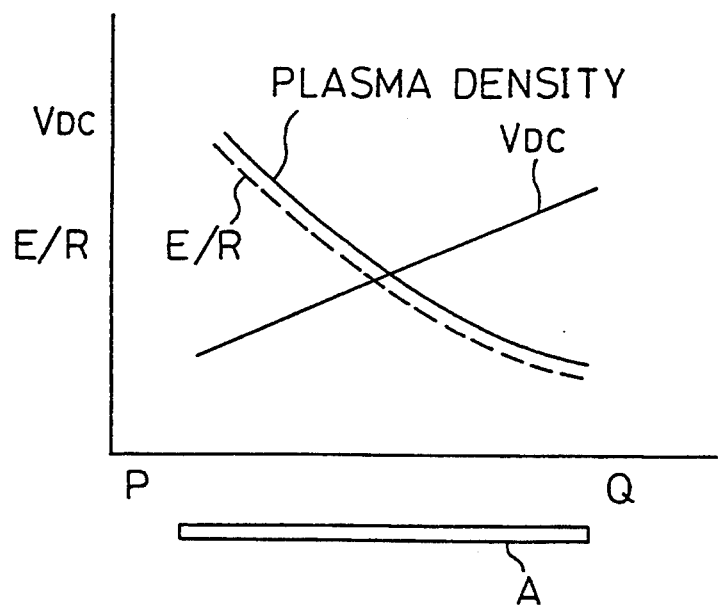
FIG. 21 is a graph showing distributions of the plasma density, the etch rate and the electric potential at a section 21—21 in FIG. 20.

Next, description is made below about concrete examples of magnetron etching system employing the above principle. When a magnetic field applying device with a below-mentioned construction is employed instead of the magnet 29 in a conventional magnetron etching system 30 in FIG. 19, a flux density of a magnetic field 38, i.e., the magnetic field distribution has a desired gradient to diverge the drifting direction of the charged particles in the plasma, thus obtaining a uniform plasma density. Namely, the charge-up on a wafer A is prevented or restricted as described later by placing the wafer A at a space with the gradient of magnetic field.

Eight concrete means for forming a gradient of magnetic field are described. Wherein, an RF electric field is applied at a right angle to the surface of the wafer A concurrently with the application of the magnetic field by each means.

Figure 3:
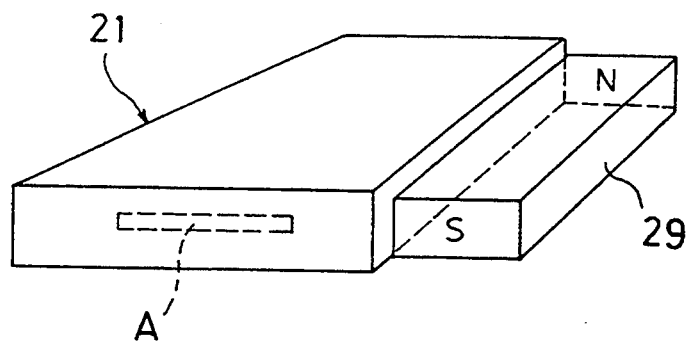
FIG. 3(a) is a schematic perspective view showing a first example of a magnetic field applying device for forming a gradient of magnetic field in a magnetron etching system according to the embodiment of the present invention.
FIG. 3(b) is a schematic plan view thereof.
Figure 3:
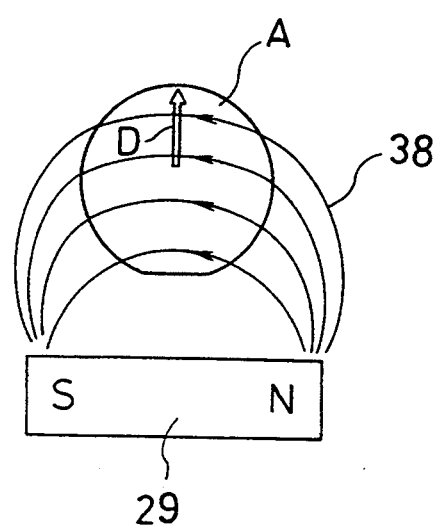

FIGS. 3(a) and (b) show a first example of the magnetic field applying device for forming the gradient of magnetic field. In the first example, the magnet 29 is arranged aside the wafer A, namely aside the treatment chamber 21. Accordingly, the magnetic field 38 has such a gradient that a flux density of the magnetic field 38 is gradually weakened in the drifting direction D of charged particles in the plasma, thus obtaining a uniform plasma density.

Figure 4:
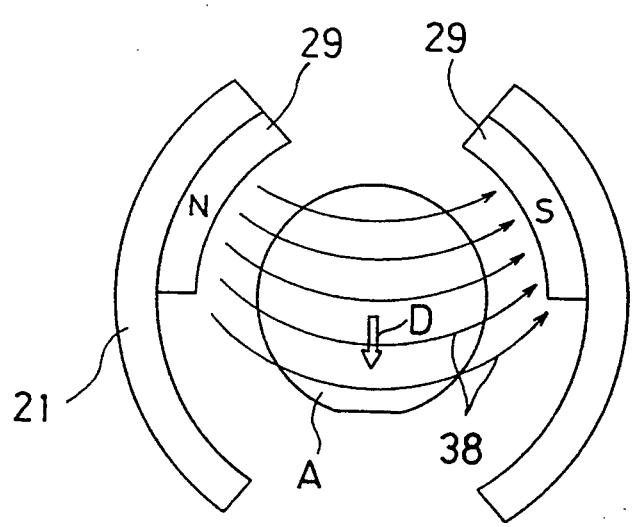
FIG. 4(a) is a schematic plan view showing a second example of the magnetic field applying device.
FIG. 4(b) is a schematic perspective view thereof.
Figure 4:
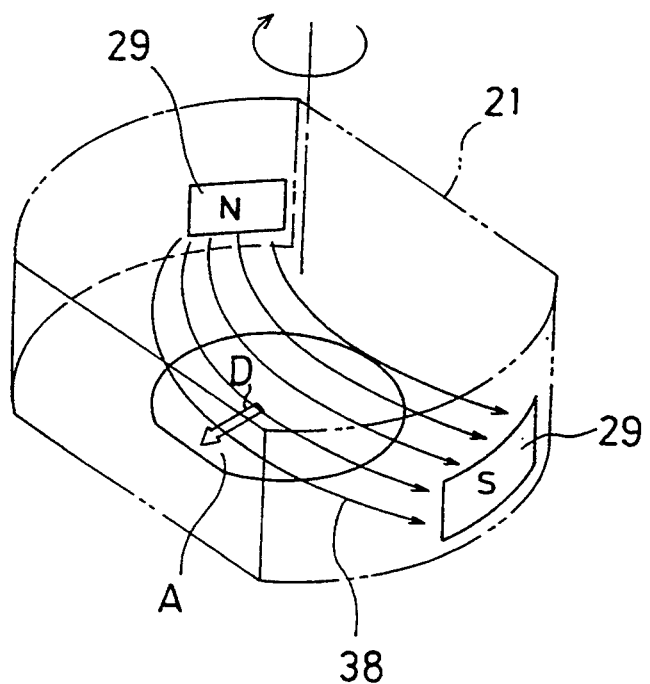

FIGS. 4(a) and (b) show a second example of the magnetic field applying device. In the second example, the magnet 29 with inside-magnet type configuration is employed in which an N-pole and an S-pole are obliquely opposed at right and left sides of the wafer A in the treatment chamber 21. In detail, the N-pole and the S-pole of the magnet 29 having an analogous curve to an outer periphery of the wafer A is provided at an inner periphery of a side wall of the treatment chamber 21 which has a substantially analogous curve thereto, and the N-pole and the S-pole of the magnet 29 are arranged on an opposed side to the drifting direction D. Thus the plasma density is uniformed.

Figure 5:
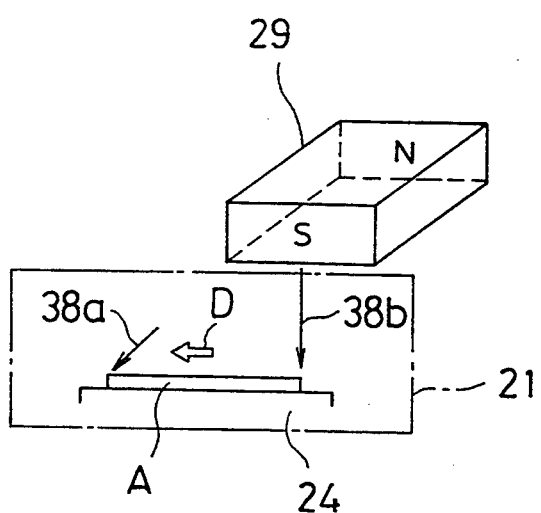
FIG. 5 is a schematic perspective view showing a third example of the magnetic field applying device.

FIG. 5 shows a third example of the magnetic field applying device. In the third example, the magnet 29 is arranged above the wafer A and off the center of the wafer A on the opposed side to the drifting direction D. Since the magnet 29 is arranged off the center of the wafer A, a weak magnetic field 38a is applied to a portion with high plasma density and a strong magnetic field 38b is applied to a portion with low plasma density, which leads to a uniform plasma density on the surface of the wafer A.

Figure 6:
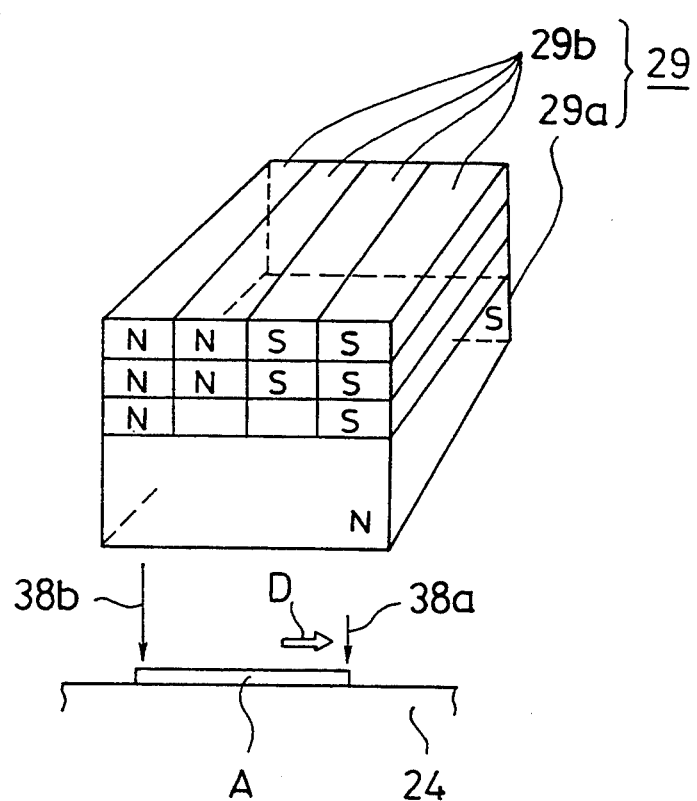
FIG. 6 is a schematic perspective view showing a fourth example of the magnetic field applying device.

FIG. 6 shows a fourth example of the magnetic field applying device. In this example, the magnet 29 is made changed in its magnetic force to form the gradient of magnetic field. In detail, on a magnet body 29a provided above the wafer A, a plurality of bar magnets 29b for controlling the magnetic field which has a same magnetizing direction as and an inverse magnetizing direction to that of the magnet body 29a are provided to give the gradient to the magnetic field of the entire magnet 29. As shown in FIG. 6, for example, on the magnet body 29a, three bar magnets 29b having the inverse magnetizing direction to that of the magnet body 29a are arranged at an end part on a side of the drifting direction D, two bar magnets 29b having the same magnetizing direction are arranged adjacent to the three bar magnets, two bar magnets 29b having the inverse magnetizing direction are arranged adjacent to the two bar magnets, and three bar magnets 29b having the same magnetizing direction are arranged adjacent to the two bar magnets. As a result, a weak magnetic field 38a is applied to the side of the drifting direction D and a strong magnetic field 38b is applied to the opposite side, thus obtaining a uniform plasma density. The number of the bar magnets 29b is optional when the bar magnets 29b are arranged such a fashion that the magnetizing directions are inverse to one another from a center of the magnet body 29a.

FIG. 7 shows a fifth example of the magnetic field applying device, in which the magnet 29 is inclined at a set angle α with respect to a parallel plane of the surface of the wafer A to form the gradient of magnetic field by lifting up the magnet 29 on the side of the drifting direction D. By inclining the magnet 29 with respect to the parallel plane of the surface of the wafer A, the magnetic lines is curved toward the direction D on the surface of the wafer A. Accordingly, the drifting direction D of the charged particles is diverged on the surface of the wafer A. In detail, a weak magnetic field 38a is applied to a portion with high plasma density and a strong magnetic field 38b is applied to a portion with low plasma density, thus obtaining a uniform plasma density.

Figure 8:
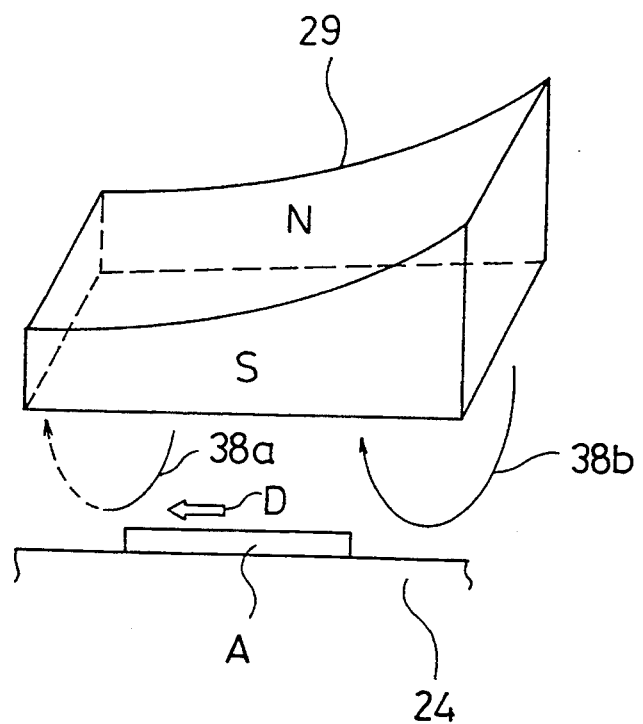
FIG. 8 is a schematic perspective view showing a sixth example of the magnetic field applying device.

FIG. 8 shows a sixth example of the magnetic field applying device in which the magnet 29 is changed in its volume to form the gradient of magnetic field. The magnet 29 decreasing in its thickness toward the side of the drifting direction D is provided above the wafer A so that a weak magnetic field 38a is applied to a portion with high plasma density and a strong magnetic field 38b is applied to a portion with low plasma density. This leads to a uniform plasma density.

Figure 9:
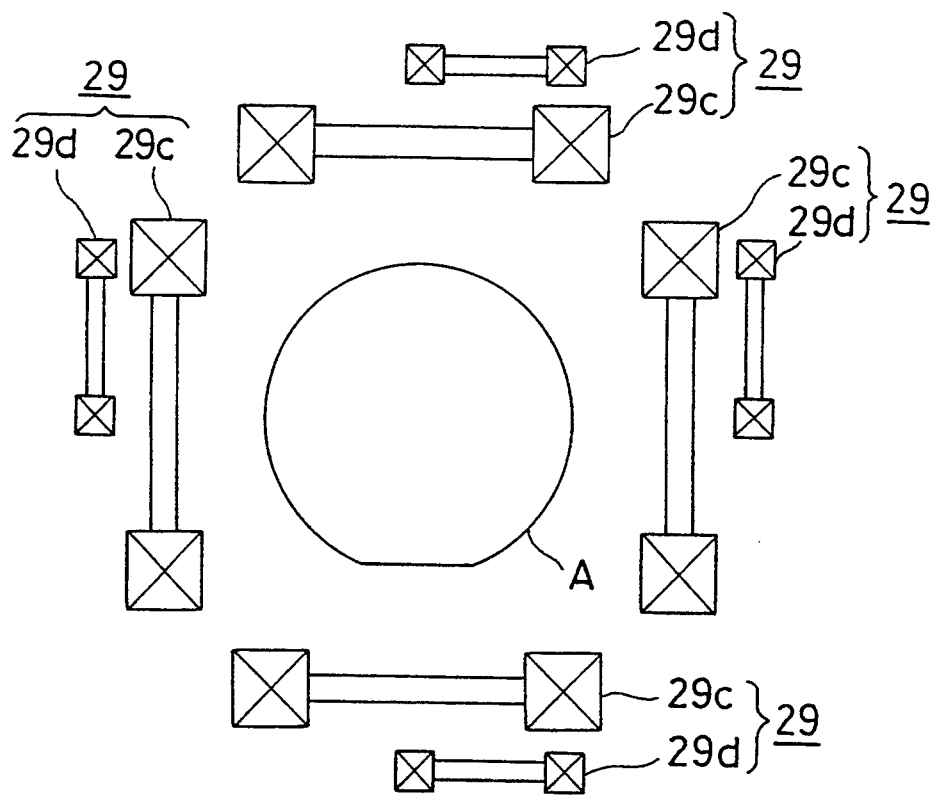
FIG. 9(a) is a schematic plan view showing a seventh example of the magnetic field applying device.
FIG. 9(b) is an explanatory drawing of a gradient of magnetic field thereof.
Figure 9:
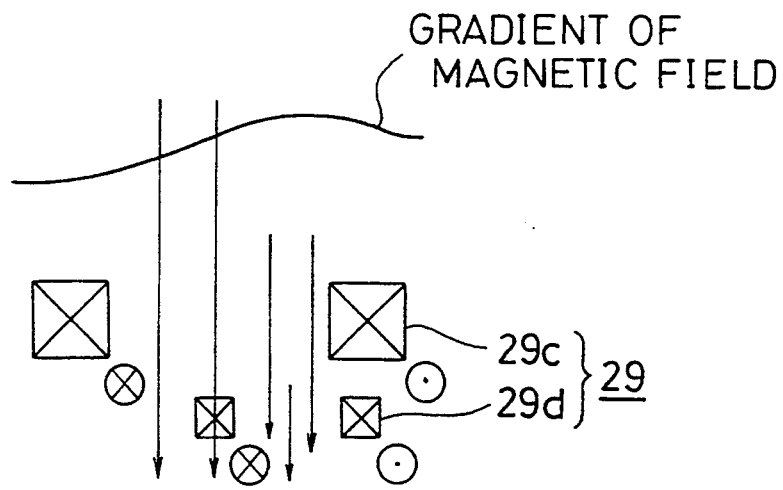

FIGS. 9(a) and (b) show a seventh example of the magnetic field applying device and the gradient of magnetic field thereof. In the seventh example, the gradient of magnetic field is formed by means of electromagnets. Two pairs of electromagnets 29c are respectively provided aside the wafer A in four peripheral directions, and a sub-electromagnet 29d is provided at a rear face of the end part of each electromagnet 29c so that the magnet field is made strong due to the sub-electromagnets 29d to have the gradient of magnetic field (see FIG. 9(b)). In this case, the electromagnets 29c and the sub-electromagnets 29d may be fixed, but the plasma density is further uniformized by rotating them.

Figure 10:
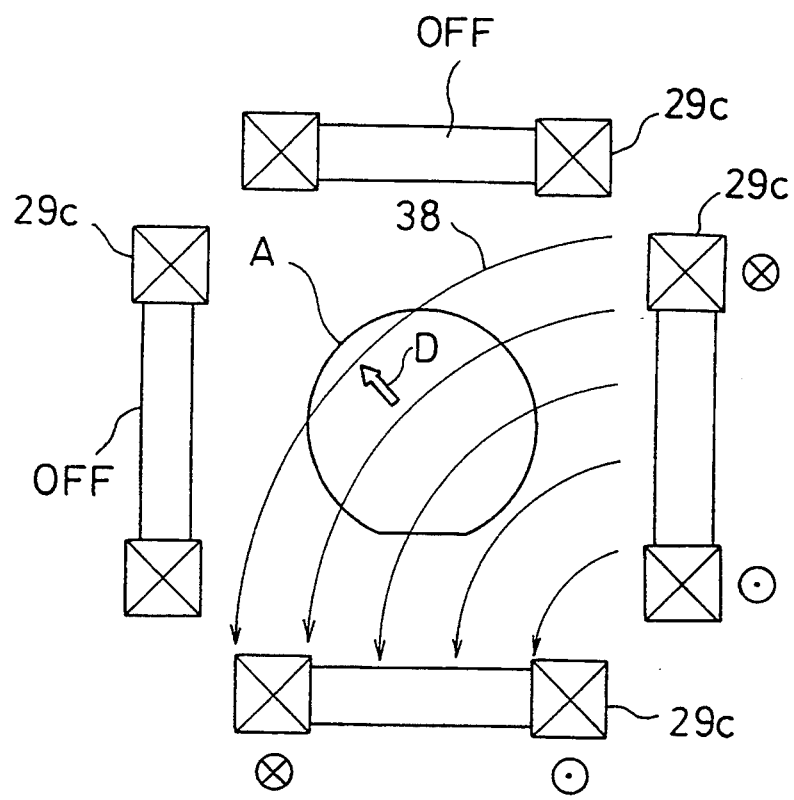
FIG. 10(a) is a schematic plan view showing an eighth example of the magnetic field applying device at a moment.
FIG. 10(b) is an equivalent drawing to FIG. 10(a) at another moment.
Figure 10:
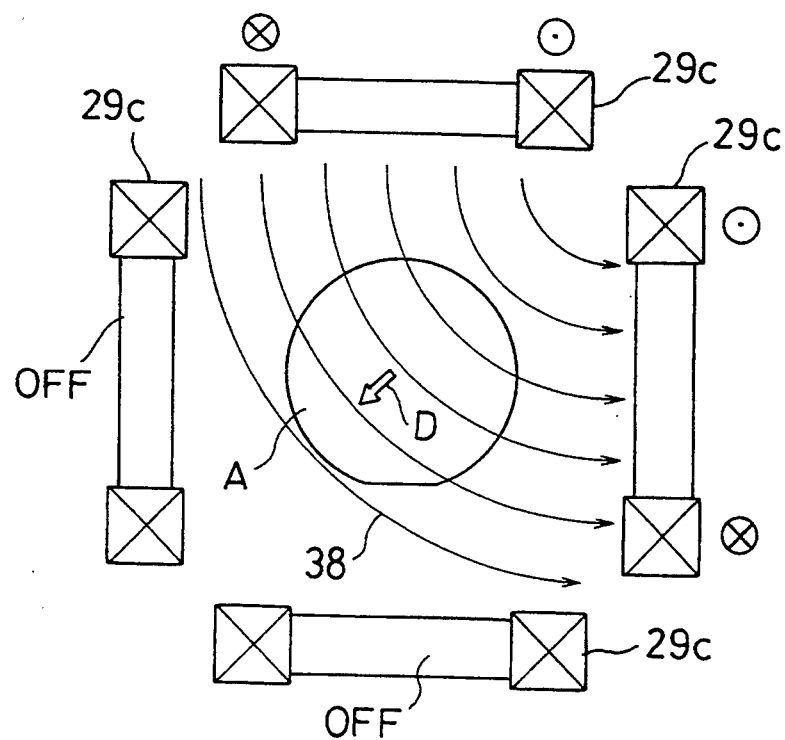

FIGS. 10(a) and (b) show an eighth example of the magnetic field applying device, which uses electromagnets for forming the gradient of magnetic field as well as in the seventh example. In the eight example electromagnets 29c are provided aside the wafer A in four peripheral directions and an electric current in a reverse direction is made flow into two adjacent electromagnets 29c to form the gradient of magnetic field. Further, the electromagnets 29c are electrically switched (FIG. 10(b)) so that two adjacent electromagnets 29c are in OFF state when the other two electromagnets 29c are in ON state. Thus, the plasma density is made uniform.

Figure 11:
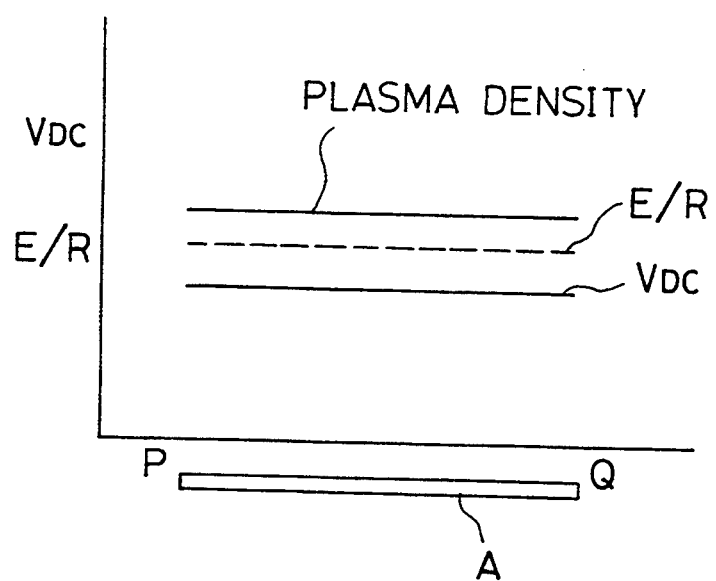
FIG. 11 is a graph showing distributions of a plasma density, an etch rate and an electric potential in the magnetron etching system according to the embodiment of the present invention.

When the wafer A is placed in a space in which the gradient of magnetic field is formed as above, the plasma density, the etch rate E/R and the electric potential $V_{DC}$ are made almost uniform on a P-Q plane of the wafer A, as shown in FIG. 11, which leads to prevention or restriction of the charge-up on the surface of the wafer A. FIG. 11 shows each distribution in this embodiment which corresponds to FIG .21 for a conventional magnetron etching system. According to this embodiment, ion sheath is also made uniform, with a result that an etched pattern is hardly curved to one side. Consequently, the etched pattern is uniformized within the surface of not only an 8-inch wafer but also a larger-diameter wafer which is being developed in future.

According to the magnetron etching system as described above, when the wafer A is etched in such a manner that the plasma is generated from the treatment gas by magnetron discharge with the RF electric field and the magnetic field 38, the magnetic field 38 which is applied in a direction intersecting with the RF electric field has such a gradient that a flux density of the magnetic field 38 is gradually weakened in the drifting direction D. This results in uniform plasma density and uniform etching treatment without the etch rate lowered. The magnet 29 may be provided at a rear face of the wafer A, or at both front and rear faces thereof to form the gradient of magnetic field in the plasma space. In consequent, the wafer A may be placed obliquely or at another place, as well as the magnet 29. In other words, the respective positions of the wafer A and the magnet 29 are set relatively.

Optimum conditions for magnetic field distribution in the above magnetron etching system is described next. The optimized conditions to be fulfilled at the same time are that: (1) the magnetic lines of flux are in parallel with the surface of the wafer A, and do not intersect therewith; (2) the magnetic flux density at a center part of the wafer A is the same as that at a peripheral part thereof; and (3) the magnetic field has such a gradient that a flux density thereof is gradually weakened in the drifting direction of the charged particles in the plasma.

Figure 12:
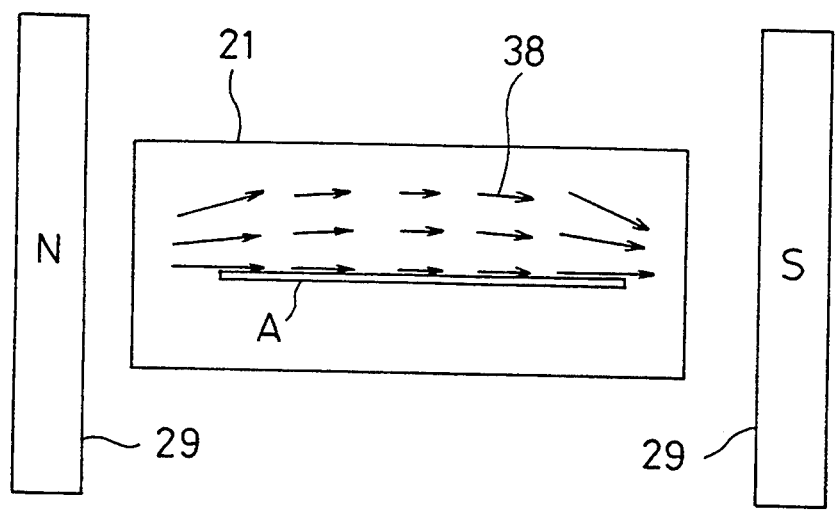
FIG. 12 is a schematic sectional front view of a magnetron etching system which shows a magnetic field distribution in a plasma treatment method according to a comparable example with the present invention.
Figure 13:
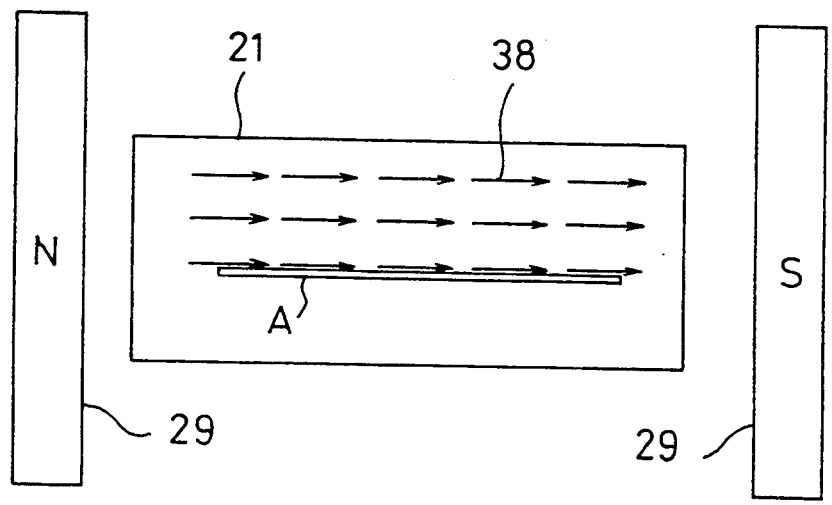
FIG. 13 is an equivalent drawing to FIG. 12 showing a magnetic field distribution in a plasma treatment method according to the embodiment of the present invention.

FIGS. 12 and 13 are respectively sectional front views of magnetron etching systems in a comparable example and in the embodiment which fulfills the optimum conditions. In the figures, arrows indicate a direction of the magnetic field 38 and each length thereof expresses the degree of the magnetic flux density. The magnetic lines of flux of the magnetic field 38 in FIG. 12 is almost in parallel with the surface of the wafer A near the center thereof and the magnetic flux density thereof is low. The magnetic flux density is high at a left end part of the wafer A and the magnetic lines of flux are curved in a diverging direction as the magnetic lines are far from the surface of the wafer A. Inversely, at a right end part of the wafer A, the magnetic lines of flux are curved in a converging direction. On the other hand, in FIG. 13, entire magnetic lines of flux of the magnetic field 38 are in parallel with the surface of the wafer A and arranged with almost equal magnetic flux density.

As to the component of the magnetic field 38 in a parallel direction (horizontal direction) with the wafer A, suppose that a ratio of a magnetic flux density B2 at the peripheral part of the wafer A to a magnetic flux density B1 at the center part thereof is R (=B2/B1). In FIG. 12, R>1, and R=1 (minimum and ideal value) in FIG. 13.

In a wafer on which an EEPROM element, for example, is formed, the flat band voltage of the element shifts owing to charge-up of an insulating layer during an etching treatment. A rate that the flat band voltage shifts owing to a change of R out of a range from −0.5 V to +0.5 V, namely a defect occurrence rate due to charge-up (hereinafter referred to it as defect rate ) is researched by an experiment. The etching treatment is carried out under conditions of 5 Pa pressure, 1000 W RF power, $CHF_3$ gas and 50 sccm gas flow amount. The magnetic flux density at the center part of the wafer A is set to 12-24 mT.

As a result of the experiment, the defect rate is about 70% when R=2.4 and is decreased to about 28% when R=1.85. It is confirmed that charge-up of the wafer A in an opposed direction (N-S direction) of N-pole and S-pole of the magnet 29 is prevented when R is set between about 1.0 and 1.5. This is because when R nears 1, the shape of the magnetic field 38 in a space of plasma discharge approximates to a horizon as well as the magnetic field 38 on the wafer A, so that a uniform plasma is generated.

Figure 14A:
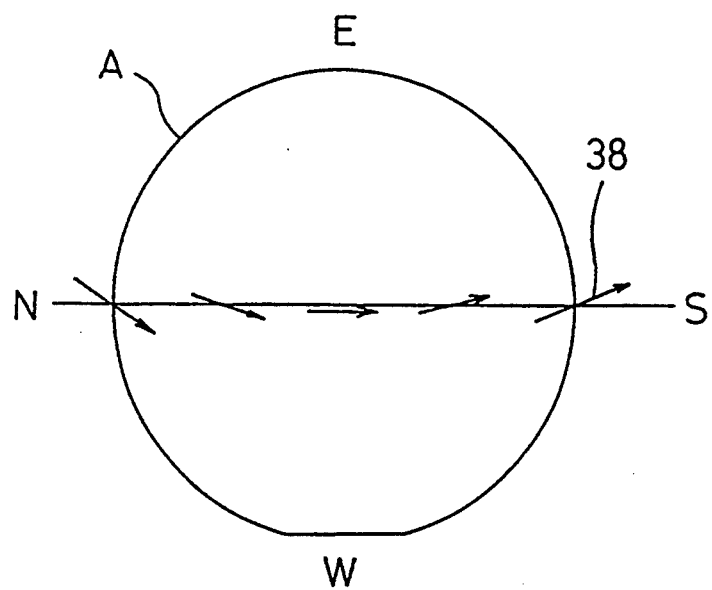
FIGS. 14(a) and (b) is a plan view for explaining a definition of divergence angle $\theta$ relating to a magnetic field distribution on a surface of a wafer.
Figure 14B:
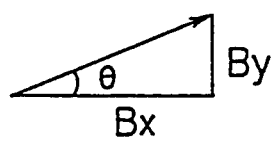

A divergence angle $\theta$ for the magnetic distribution on the wafer A is defined with reference to FIGS. 14(a) and (b). Arrows in FIG.14(a) indicate a direction of the magnetic field 38 and each length thereof expresses the degree of the magnetic flux density. The electric field (not shown) is applied at a right angle to the paper. Suppose that the opposed direction (N-S direction) is an X-axis and a direction at a right angle to the X-axis (E-W direction) is a Y-axis. When a projection length of the arrow of the magnetic field 38 having an effect at the right end part of the wafer A to the X-axis is Bx and that to the Y-axis is By, the divergence angle $\theta$ is $\tan^{-1}(By/Bx)$.

Figure 15:
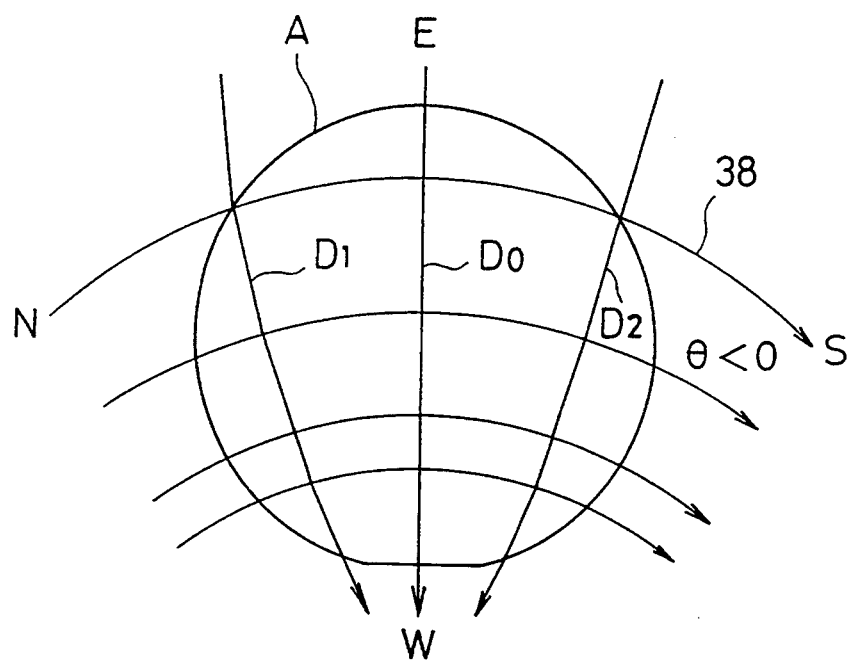
FIG. 15 is a plan view of the magnetic field distribution in a plasma treatment method according to a comparable example with the present invention.
Figure 16:
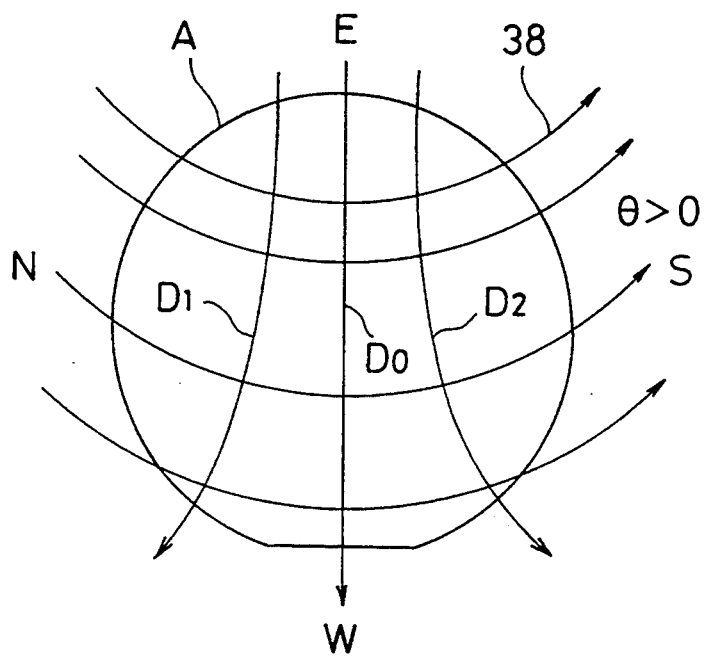
FIG. 16 is an equivalent drawing to FIG. 15 according to the embodiment of the present invention.
Figure 17:
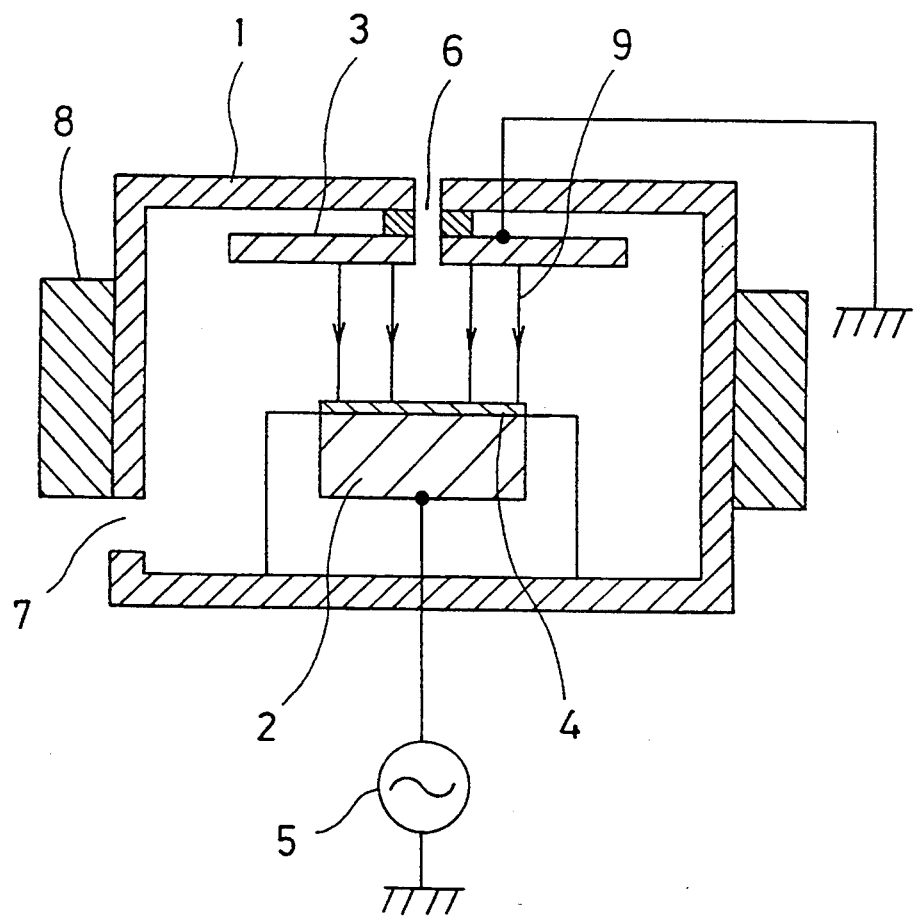
FIG. 17 is a schematic sectional front view of a conventional plasma treatment system.

FIGS. 15 and 16 are plan views respectively showing the magnetic field distributions in case of $\theta < 0$ (comparable example) and in case of $\theta > 0$ (embodiment). In FIG. 15, the magnetic field 38 is distributed so as to be curved toward E side, and has such a gradient that a flux density thereof is gradually strengthened in drifting directions D0-D2 of charged particles in the plasma, i.e., from E toward W. Therefore, the drifting directions D0-D2 are converged and the charge-up amount in E-W direction is increased more than conventional one (FIG. 18). On the other hand, in FIG. 16, the magnetic field 38 is distributed so as to be curved toward W side, and has such a gradient that a flux density thereof is gradually weakened from E toward W. Thus, the drifting directions D0-D2 are diverged to decrease the charge-up amount in E-W direction.

Studying a $\theta$ dependency of defect rate in the same etching conditions as in the case of the above R dependency, the defect rate is 58% when $\theta = 0$, and is worse than 58% when $\theta < 0$. When $\theta = +3.8°$, the defect rate is decreased to 5%. It is confirmed that the charge-up of the wafer A in E-W direction is prevented when $\theta$ is set in a range between about $+1°$ and $+89°$.

In the above embodiment, the present invention is applied to the plasma etching. However, the present invention is applicable to every case for generating magnetron plasma, for example, to a sputtering system, a plasma CVD system, an ion source, an electron beam source, an X-ray source, an ashing system, and the like.

Also, in the above embodiment, the magnetic field has the gradient, but the drifting direction of charged particles in the plasma may be controlled by giving a gradient to the electric field. This results in the same effect as in the case where the magnetic field has a gradient.

While the present invention is described according to drawings and examples for the sake of well understanding, it is to be understood that modifications will occur to those skilled in the art without departing from the scope of claims.

We claim:

1. An apparatus for generating a plasma from a gas in a chamber, in which a reduced pressure is maintained by a magnetron discharge with an electric field and a magnetic field, comprising:
   at least two electrodes provided in said chamber for applying an electric field to a space between said electrodes so as to ionize a gas in said space; and
   a magnetic field applying device for applying a curved lateral magnetic field in a direction perpendicular to and intersecting with the electric field applied by said electrodes to said space so that charged particles generated from the gas in said space drift and diverge owing to Lorentz force acting on each of the charged particles by means of the electric field applied by said electrodes and the magnetic field applied by said magnetic field applying device.

2. An apparatus for generating a plasma from a gas in a chamber, in which a reduced pressure is maintained, by a magnetron discharge with an electric field and a magnetic field, comprising:
   at least two electrodes provided in said chamber for applying an electric field to a space between said electrodes so as to ionize a gas in said space; and
   a magnetic field applying device for applying a curved lateral magnetic field in a direction perpendicular to and intersecting with the electric field applied to said electrodes to said space so that charged particles generated from the gas in said space drift owing to Lorentz force acting on each of the charged particles by means of the electric field applied by said electrodes and the magnetic field applied by said magnetic field applying device, the magnetic field having such a gradient that a flux density of the magnetic field is gradually weakened in a drifting direction of the charged particles.

3. The apparatus according to claim 2, wherein said magnetic field applying device comprises a magnet arranged aside from said chamber.

4. The apparatus according to claim 2, wherein said magnetic field applying device comprises a magnet arranged on an inner periphery of a curved side wall of said chamber.

5. The apparatus according to claim 2, wherein said magnetic field applying device comprises a magnet which faces a wafer surface disposed in said chamber and is arranged off the center of the wafer surface on an opposite side to the drifting direction of the charged particles.

6. The apparatus according to claim 2, wherein said magnetic field applying device comprises a main magnet, and a plurality of sub-magnets which have the same magnetizing direction and an inverse magnetizing direction to that of said main magnet.

7. The apparatus according to claim 2, wherein said magnetic field applying device comprises a magnet which is inclined at a set angle with respect to a wafer surface disposed in said chamber.

8. The apparatus according to claim 2, wherein said magnetic field applying device comprises a magnet which faces a wafer surface disposed in said chamber and gradually decreases its thickness toward the side of the drifting direction of the charged particles.

9. The apparatus according to claim 2, wherein said magnetic field applying device comprises four electromagnets which are arranged aside in four peripheral directions of a wafer disposed in said chamber and are electrically switched so that two adjacent ones of said four electromagnets are in an ON state and the other two of said four electromagnets are in an OFF state.

10. The apparatus according to claim 2, wherein said magnetic field applying device comprises four main electromagnets arranged aside in four peripheral directions of a wafer disposed in said chamber, and four sub-electromagnets respectively arranged aside to said main electromagnets.

11. The apparatus according to claim 10, wherein said main electromagnets and said sub-electromagnets are rotated.

12. A method of generating a plasma from a gas in a space with reduced pressure by a magnetron discharge with an electric field and a magnetic field, comprising the steps of:

introducing a gas into said space;

applying an electric field to said space so as to ionize the gas introduced into said space; and applying a curved lateral magnetic field in a direction perpendicular to and intersecting with the applied electric field to said space so that charged particles generated from the gas in said space drift and diverge owing to Lorentz force acting on each of the charged particles by means of the applied electric field and the applied magnetic field, with the curved lateral magnet field maximizing the divergence of the charged particles.

13. A method of generating a plasma from a gas in a spaced with reduced pressure by a magnetron discharge with an electric field and a magnetic field, comprising the steps of:

introducing a gas into said space;

applying an electric field to said space so as to ionize the gas introduced into said space; and applying a curved lateral magnetic field in a direction perpendicular to and intersecting with the applied electric field to said space so that charged particles generated from the gas in said space drift owing to Lorentz force acting on each of the charged particles by means of the applied electric field and the applied magnetic field, the magnetic field having such a gradient that a flux density of the magnetic field is gradually weakened in a drifting direction of the charged particles.

* * * * *